(12) United States Patent
Morgan et al.

(10) Patent No.: US 9,930,772 B2
(45) Date of Patent: Mar. 27, 2018

(54) PRINTED CIRCUIT AND CIRCUIT BOARD ASSEMBLY CONFIGURED FOR QUAD SIGNALING

(71) Applicants: TYCO ELECTRONICS CORPORATION, Berwyn, PA (US); TYCO ELECTRONICS JAPAN G.K., Kawasaki-shi (JP)

(72) Inventors: Chad William Morgan, Carneys Point, NJ (US); Masayuki Aizawa, Tokyo (JP); Arash Behziz, Newbury Park, CA (US); Brian Patrick Costello, Scotts Valley, CA (US); Nathan Lincoln Tracy, Harrisburg, PA (US); Michael David Herring, Apex, NC (US)

(73) Assignees: TE CONNECTIVITY CORPORATION, Berwyn, PA (US); TYCO ELECTRONICS JAPAN G.K., Kawasaki-Shi (JP)

( * ) Notice: Subject to any disclaimer, the term of this patent is extended or adjusted under 35 U.S.C. 154(b) by 262 days.

(21) Appl. No.: 14/983,829

(22) Filed: Dec. 30, 2015

(65) Prior Publication Data
US 2017/0196079 A1    Jul. 6, 2017

(51) Int. Cl.
*H05K 1/02* (2006.01)
(52) U.S. Cl.
CPC .................... *H05K 1/0245* (2013.01)

(58) Field of Classification Search
CPC combination set(s) only.
See application file for complete search history.

(56) References Cited

U.S. PATENT DOCUMENTS

| | | | |
|---|---|---|---|
| 6,566,761 B1 * | 5/2003 | Sharma | H01L 23/49816 257/691 |
| 6,657,293 B1 * | 12/2003 | Fumihira | H01L 23/49827 257/690 |
| 9,769,925 B2 * | 9/2017 | Chan | H05K 1/113 |
| 2011/0268225 A1 | 11/2011 | Cronie et al. | |

OTHER PUBLICATIONS

Kandou's Interfaces for High Speed Serial Links; WHITE PAPER; Version 1.9; May 17, 2013; 8 pages.

* cited by examiner

*Primary Examiner* — An Luu

(57) ABSTRACT

Printed circuit includes a planar substrate having opposite sides and a thickness extending therebetween. The sides extend parallel to a lateral plane. The printed circuit also includes a plurality of conductive vias extending through the planar substrate in a direction that is perpendicular to the lateral plane. The conductive vias include ground vias and signal vias. The signal vias form a plurality of quad groups in which each quad group includes a two-by-two array of the signal vias. Optionally, the printed circuit also includes signal traces that electrically couple to the signal vias. The signal traces may form a plurality of quad lines in which each quad line includes four of the signal traces. The four signal traces of each quad line may extend parallel to one another and be in a two-by-two formation.

20 Claims, 7 Drawing Sheets

PRINTED CIRCUIT AND CIRCUIT BOARD ASSEMBLY CONFIGURED FOR QUAD SIGNALING

BACKGROUND

The subject matter relates generally to printed circuits having multiple conductive pathways for multiple signal lines.

Electrical connectors may be used within communication systems, such as telecommunication equipment, servers, data storage, transport devices, and the like. Some communication systems include interconnection systems that have a backplane or midplane circuit board and a plurality of daughter card assemblies that are configured to be mounted to the circuit board. For simplicity, the following only refers to a backplane circuit board, but it should be understood that a midplane circuit board may be used in a similar manner. Each of the daughter card assemblies includes a receptacle connector that is secured to a daughter card. The backplane circuit board has a plurality of header connectors that are mounted thereto. Each of the receptacle connectors is configured to mate with a respective header connector thereby communicatively coupling the corresponding daughter card assembly to the backplane circuit board. The backplane circuit board includes conductive vias and traces that interconnect different daughter card assemblies. Accordingly, different daughter card assemblies may be communicatively coupled to one another through the backplane circuit board.

The electrical components of these interconnection systems are typically configured for differential signaling. For example, the conductive vias of the backplane circuit board are electrically coupled to one another through the conductive traces. The conductive vias and the conductive traces are typically patterned to form pairs (referred to as "differential pairs"). The conductive traces for each differential pair have similar paths in order to reduce skew. In conventional differential signaling, two complementary signals are transmitted through the two conductive pathways of the differential pair. Data may be determined from a voltage difference between the two conductive pathways or current strength and direction in the two conductive pathways.

Although differential signaling systems are effective in communicating data, it has become more difficult to increase the bandwidth of these systems. More recently, a new signaling technique has been developed. The signaling technique is hereinafter referred to as "quad signaling" and is described in greater detail in U.S. Publ. No. 2011/0268225. Unlike differential signaling, which uses only two conductive pathways per signal line, the new signaling technique may use, for example, four conductive pathways for three signal lines. Thus, quad signaling may provide three signal lines while differential signaling may only provide two signal lines using the same number of conductive pathways. Although quad signaling may be implemented on the same electrical components used for differential signaling applications, the footprints of the conductive pathways may be improved so that quad signaling has more practical and commercial value.

Accordingly, there is a need for electrical components, such as printed circuits and circuit board assemblies, having footprints that are configured for quad signaling.

BRIEF DESCRIPTION

In an embodiment, a printed circuit is provided that includes a planar substrate having opposite sides and a thickness extending therebetween. The sides extend parallel to a lateral plane. The printed circuit also includes a plurality of conductive vias extending through the planar substrate in a direction that is perpendicular to the lateral plane. The conductive vias include ground vias and signal vias. The signal vias are arranged to form a plurality of quad groups in which each quad group includes a two-by-two arrangement of the signal vias. The ground vias are positioned between adjacent quad groups. The printed circuit also includes a plurality of signal traces that are coupled to the planar substrate and extend parallel to the lateral plane. The signal traces are electrically coupled to respective signal vias of the quad groups to form a plurality of quad lines. Each of the quad lines includes the signal vias of a corresponding quad group and four of the signal traces. The four signal traces of each quad line extend parallel to one another and are in a two-by-two formation in which two of the signal traces are at a first depth in the planar substrate and the other two signal traces are at a second depth in the planar substrate.

In an embodiment, a printed circuit is provided that includes a planar substrate having opposite sides and a thickness extending therebetween. The sides extend parallel to a lateral plane. The printed circuit also includes a quad array of conductive vias that extend through the planar substrate in a direction that is perpendicular to the lateral plane. The conductive vias include ground vias and signal vias. The signal vias form a plurality of quad groups in which each quad group includes a two-by-two arrangement of the signal vias configured for quad signaling. The ground vias form shield arrays that surround respective quad groups and are configured to reduce crosstalk between adjacent quad groups.

In an embodiment, a circuit board assembly is provided that includes an electrical connector having a connector housing and a connector array of signal and ground contacts that are coupled to the connector housing. The circuit board assembly also includes a circuit board having the electrical connector mounted thereto. The circuit board includes a planar substrate having opposite sides and a thickness extending therebetween. The sides extend parallel to a lateral plane. The circuit board also includes a plurality of conductive vias extending through the planar substrate in a direction that is perpendicular to the lateral plane. The conductive vias include ground vias and signal vias. The signal vias form a plurality of quad groups in which each quad group includes a two-by-two arrangement of the signal vias. The ground vias form shield arrays that surround respective quad groups and are configured to reduce crosstalk between adjacent quad groups. The signal and ground contacts of the connector array are configured to electrically and mechanically couple to the signal and ground vias, respectively, of the printed circuit.

DETAILED DESCRIPTION

Figure 1:
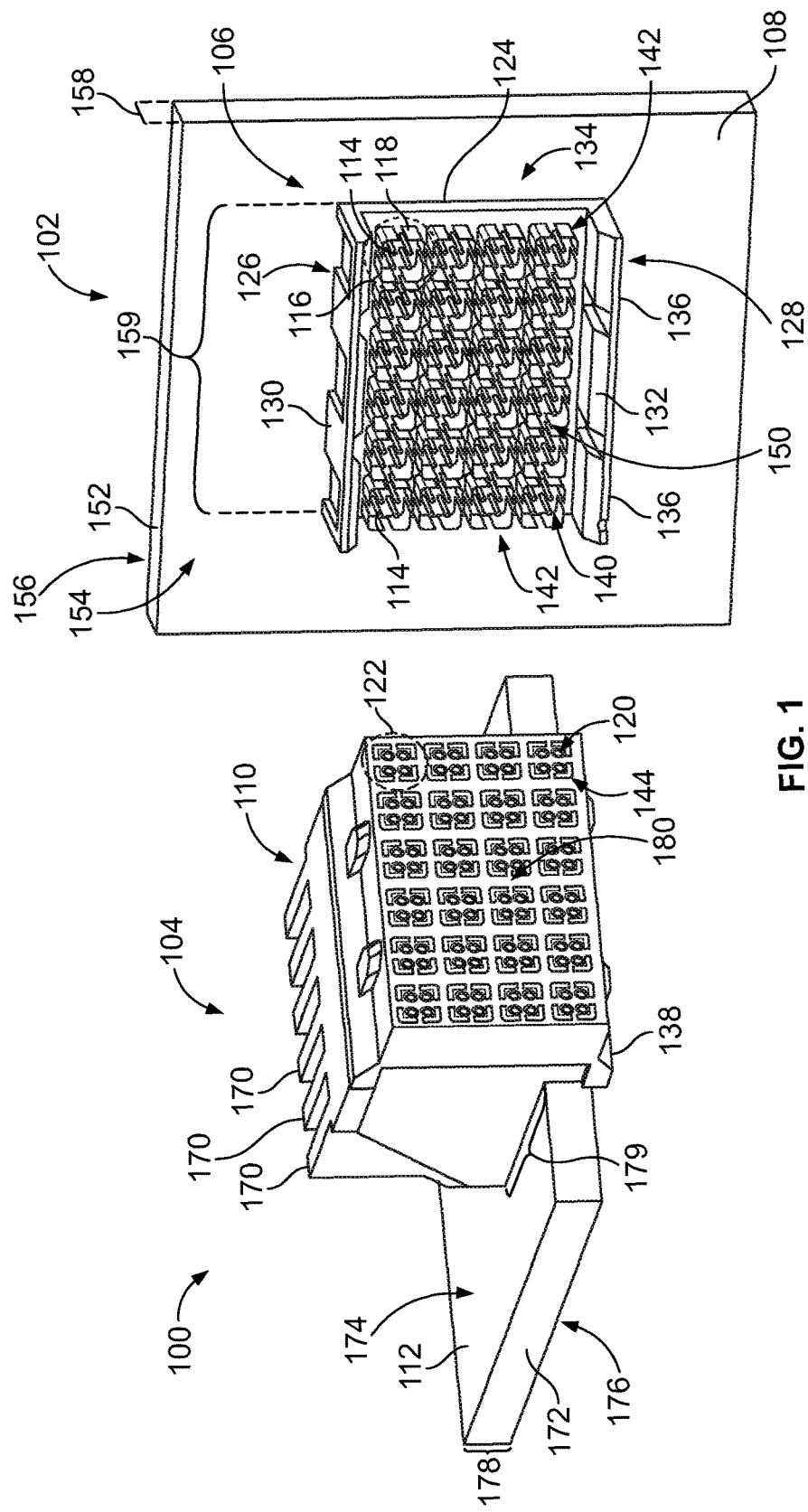
FIG. 1 illustrates an interconnection system having first and second circuit board assemblies in accordance with an embodiment. The first and second circuit board assemblies are unmated in FIG. 1.

Embodiments set forth herein may include printed circuits having patterns or footprints of conductive vias and/or conductive traces that are configured for quad signaling. Embodiments may also include interconnection systems or circuit board assemblies that have such printed circuits. The interconnection system may be, for example, a backplane interconnection system or a midplane interconnection system. A circuit board assembly may include a circuit board and at least one electrical connector mounted thereto. For example, a circuit board assembly may include a daughter card having at least one electrical connector mounted thereto or a backplane circuit board having at least one electrical connector mounted thereto. In some embodiments, the circuit board may have a high density array of conductive vias that are configured to receive conductor tails from the electrical connector.

The conductive vias and traces form quad lines. As used herein, a "quad line" includes four signal pathways having a designated spatial relationship that permits quad signaling. In one example, each quad line includes four signal traces and at least four conductive vias. Each conductive via electrically couples to a respective signal trace of the four signal traces. The four conductive vias may define one terminating end of the quad line. In some embodiments, the quad line also includes an additional four conductive vias at an opposite terminating end of the quad line. In a second example, the quad line may include only four conductive vias. In such embodiments, each of the conductive vias may be a plated thru-hole (PTH) that is configured to receive a conductor tail at each end of the PTH.

Each of the signal pathways in a quad line is configured to transmit signals relative to the signals transmitted by the other signal pathways in the quad line. Similar to differential signaling, the signals in the four signal pathways may be varied relative to one another to communicate data. This is referred to herein as quad signaling. The concept of quad signaling (also referred to as "orthogonal differential vector signaling") is described in U.S. Publ. No. 2011/0268225 and has been investigated by Kandou Bus. Exemplary electrical connectors configured for quad signaling are described in U.S. patent application Ser. No. 14/328,776, filed on Apr. 11, 2014, which is incorporated herein by reference in its entirety. Quad signaling enables transmitting three signals through four conductive pathways (e.g., conductors), which are collectively referred to as a "quad line" or "quad." Each quad line should be relatively isolated from other quad lines, and each conductive pathway within a quad line should be approximately equally coupled to the three other conductive pathways of the same quad line. Skew among the signal pathways within a quad line should be minimized.

In the printed circuits, the four signal traces of a quad line extend parallel to one another for substantially an entire length of the quad line such that the signal traces are in a two-by-two formation through the printed circuit. In some patterns or footprints, two of the signal traces may jog away and back toward the other two signal traces to reduce skew. Proximate to the terminating end of the quad line, the signal traces may break from the two-by-two formation to electrically couple to the respective conductive vias.

The conductive vias and the conductive traces may be patterned relative to one another to facilitate quad signaling through a printed circuit. The printed circuit may be a printed circuit board (PCB) or a flexible circuit. Exemplary circuit boards include a backplane/midplane circuit board or a daughter card. The conductive vias and the conductive traces may be patterned relative to one another in order to minimize or eliminate skew between the conductive traces and reduce crosstalk between quad lines. The conductive vias and the conductive traces may also be patterned to balance the impedances of the three different modes that can travel within a quad line.

Embodiments may be capable of transmitting data signals at high data rates, such as at least 20 gigabits per second (Gb/s), 30 Gb/s, 40 Gb/s, 50 Gb/s, or more. The signal vias may form a high-density array of quad lines. A high-density array of quad lines may have, for example, at least 5 quad lines (20 signal vias) per 120 mm$^2$ along a designated area of the printed circuit. In more particular embodiments, the high-density array may have at least 8 quad lines (32 signal vias) per 120 mm$^2$ or at least 10 quad lines (40 signal vias) per 120 mm$^2$.

As used herein, phrases such as "a plurality of [elements]" and the like, when used in the detailed description and claims, do not necessarily refer to each and every element that a component may have. The component may have other elements that are similar to the plurality of elements. For example, the phrase "a plurality of ground vias [being/having a recited feature]" does not necessarily mean that each and every ground via of the component has the recited feature. Other ground vias may not include the recited feature. Accordingly, unless explicitly stated otherwise (e.g., "each and every ground via [being/having a recited feature]"), embodiments may include similar elements that do not have the recited features.

FIG. 1 is a perspective view of a portion of an interconnection system 100 formed in accordance with an embodiment. The interconnection system 100 includes a first circuit board assembly 102 and a second circuit board assembly 104 that are configured to mate with each other. The first circuit board assembly 102 includes an electrical connector 106 and a printed circuit 108. The second circuit board assembly 104 includes an electrical connector 110 and a printed circuit 112. The electrical connectors 106, 110 are mounted to the circuit boards 108, 112, respectively. In the illustrated embodiment, the printed circuits 108, 112 are PCBs and, as such, are hereinafter referred to as circuit boards.

The electrical connectors 106, 110 are configured to be mated to one another to form electrical and mechanical connections therebetween. The electrical connector 106 may be embodied as, and referred to hereinafter as, a header connector 106. The electrical connector 110 may be embodied as, and referred to hereinafter as, a receptacle connector 110. The receptacle connector 110 is configured to be coupled to the header connector 106. Optionally, the receptacle connector 110 may be part of a daughter card assembly and the header connector 106 may be part of a backplane or midplane system, or vice versa. Optionally, the header connector 106 and/or the receptacle connector 110 may be part of a line card or a switch card.

As set forth herein, the header connector 106 and the receptacle connector 110 each include quad groups of signal contacts (or conductors) that are configured for quad signaling. Each signal contact in each quad group is configured to be electrically coupled to a corresponding signal contact of the other electrical connector. For example, the header connector 106 includes signal contacts 114 that are arranged in quad groups 116 and ground shields (or ground contacts) 118 that surround the quad groups 116. The receptacle connector includes signal contacts 120 that are arranged in quad groups 122. Each of the quad groups 116 is configured to electrically couple to a respective quad group 122.

The header connector 106 includes a connector housing 124 having a first end 126 and a second end 128. The connector housing 124 includes endwalls 130 and 132 at the first and second ends 126, 128, respectively. The endwalls 130 and 132 define a cavity 134 therebetween. The cavity 134 is configured to receive the receptacle connector 110 therein. The endwalls 130, 132 may include alignment guides 136 configured to align the receptacle connector 110 with the header connector 106 when the receptacle connector 110 is inserted into the cavity 134.

The signal contacts 114 are arranged in the cavity 134 to form the quad groups 116. Each of the quad groups 116 has four signal contacts 114. The ground shields 118 surround each quad group 116 and provide electrical shielding for the corresponding quad group 116. Each of the signal contacts 114 has a mating end 140 for electrically coupling with the corresponding signal contact 120 of the receptacle connector 110. Each of the ground shields 118 has a mating end 142 for electrically coupling with a corresponding ground contact 144 of the receptacle connector 110. The signal contacts 114 and the ground shields 118 collectively form a connector array 150 of the header connector 106.

The circuit board 108 includes a planar substrate 152 having opposite first and second sides 154, 156 and a thickness 158 extending therebetween. The header connector 106 is mounted to a mounting region 159 of the circuit board 108 along the first side 154. The mounting region 159 includes a quad array of conductive vias (not shown) that extend through (e.g., partially or entirely) the planar substrate 152. These conductive vias are selectively arranged along the mounting region 159 and configured to receive tails (not shown) of the signal contacts 114 and the ground shields 118. The signal contacts 114 and the ground shields 118 electrically terminate to the circuit board 108.

The receptacle connector 110 includes a connector housing 138 used to hold a plurality of contact modules 170. The contact modules 170 are held in a stacked configuration generally parallel to one another. The contact modules 170 hold the signal contacts 120 and the ground contacts 144. The signal contacts 120 are electrically connected to the circuit board 112 and define signal pathways through the receptacle connector 110. The signal contacts 120 and the ground contacts 144 collectively form a connector array 180 of the receptacle connector 110.

The circuit board 112 includes a planar substrate 172 having opposite first and second sides 174, 176 and a thickness 178 extending therebetween. The receptacle connector 110 is mounted to a mounting region 179 of the circuit board 112 along the first side 174. The signal contacts 120 and the ground contacts 144 electrically terminate to the circuit board 112 within the mounting region 179. The mounting region 179 includes a quad array of conductive vias (not shown) that extend through (e.g., partially or entirely) the planar substrate 172.

When the receptacle connector 110 is coupled to the header connector 106, the circuit board 108 is orientated perpendicular to the circuit board 112. When coupled, the signal contacts 114 are electrically connected to the signal contacts 120, and the ground shields 118 are electrically connected to the ground contacts 144. In this manner, the header connector 106 and the receptacle connector 110 electrically couple the circuit board 108 to the circuit board 112. Exemplary electrical connectors that are configured for quad signaling, such as the electrical connectors 106, 110, are described in U.S. patent application Ser. No. 14/328,776, filed on Apr. 11, 2014, which is incorporated herein by reference in its entirety.

For at least one of the circuit boards 108, 112, the conductive vias may be similar to conductive vias 206 (shown in FIG. 2) or other conductive vias described below. The circuit boards 108, 112 may have corresponding footprints of the respective conductive vias. Each of the circuit boards 108, 112 may also have corresponding patterns of conductive traces that electrically couple to the conductive vias. As described herein, the conductive vias and the conductive traces are positioned relative to one another to facilitate quad signaling. The circuit board 108, 112 may be similar or identical to the printed circuits described below.

The printed circuits described herein, such as the circuit boards 108, 112, may be manufactured through a variety of fabrication technologies. For example, the printed circuits may be manufactured through known PCB technologies. Each of the printed circuits may be a laminate or sandwich structure that includes a plurality of stacked substrate layers. Each substrate layer may include, at least partially, an insulating dielectric material. By way of example, the substrate layers may include a dielectric material (e.g., flame-retardant epoxy-woven glass board (FR4), FR408, polyimide, polyimide glass, polyester, epoxy-aramid, metals, and the like); a bonding material (e.g., acrylic adhesive, modified epoxy, phenolic butyral, pressure-sensitive adhesive (PSA), preimpregnated material, and the like); a conductive material that is disposed, deposited, or etched in a predetermined manner; or a combination of the above. The conductive material may be copper (or a copper-alloy), cupro-nickel, silver epoxy, conductive polymer, and the like. It should be understood that substrate layers may include sub-layers of, for example, bonding material, conductive material, and/or dielectric material. It should also be understood that conductive vias may extend through only one substrate layer or multiple stacked substrate layers, including the entire printed circuit.

It is contemplated that, in some embodiments, the printed circuits may include a flexible material such that the substrate layers form a flexible printed circuit. The flexible material may be, for example, polyimide. For such embodiments, designated sections of the printed circuits may optionally include a rigid material. For example, one or two substrate layers may include a rigid material thereby causing the printed circuits to be more rigid yet still flexible. As another example, a stiffener may be applied to one or both sides of the printed circuit. The stiffener may cover less than the entire printed circuit such that a portion of the printed circuit is rigid and another portion of the printed circuit is flexible.

Figure 2:
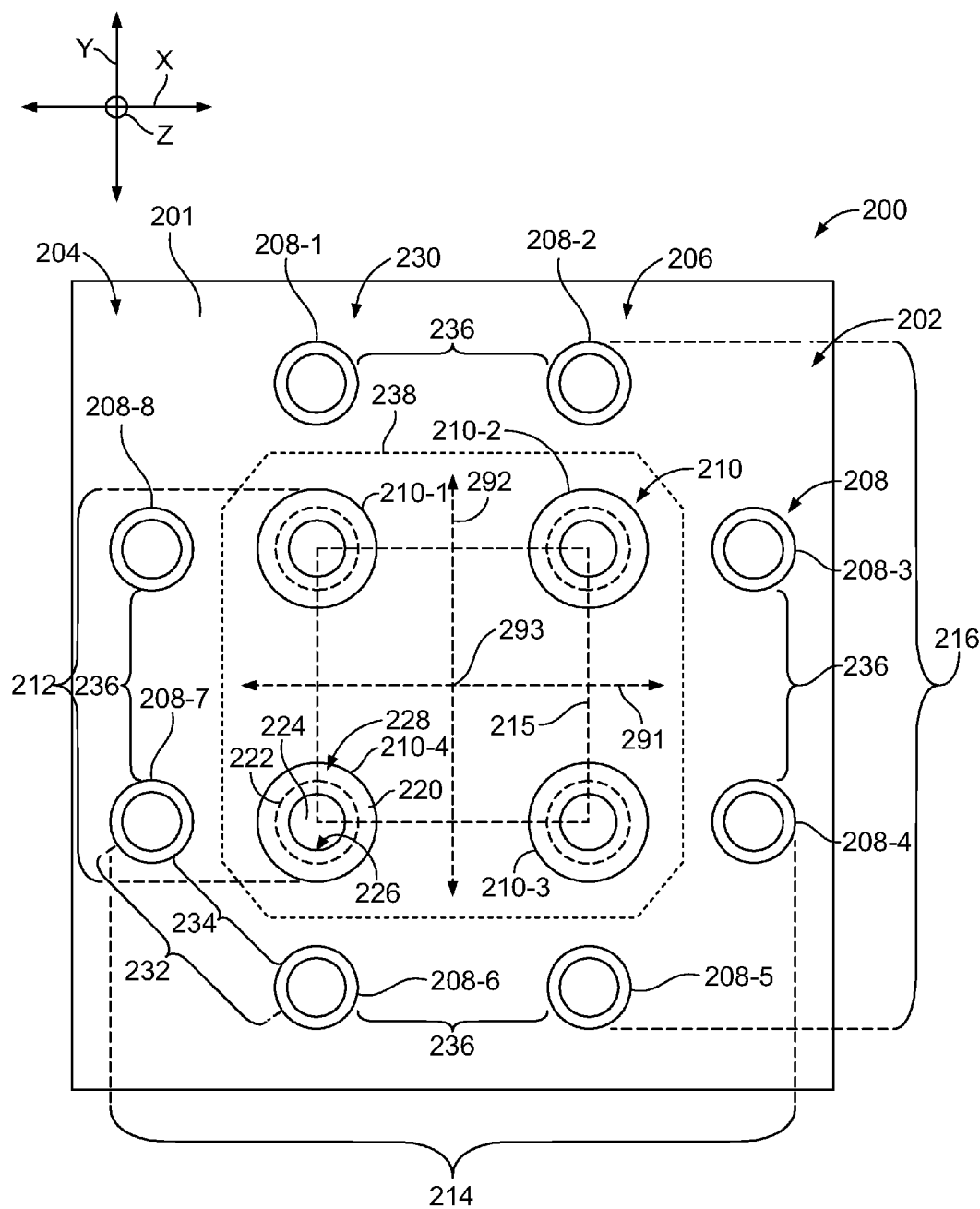
FIG. 2 is a plan view of a portion of a printed circuit formed in accordance with an embodiment.

FIG. 2 is a plan view of a portion of a printed circuit 200 in accordance with an embodiment. Similar to the circuit boards 108, 112 (FIG. 1), the printed circuit 200 includes a first side 204 and an opposite second side (not shown) and a planar substrate 201 that extends therebetween. For reference, the printed circuit 200 is shown relative to X, Y, and Z axes. The X and Y axes define a lateral plane 294 (shown in FIG. 4) that extends parallel to the first side 204 and the second side (not shown). The Z axis is perpendicular to the lateral plane 294 and, as such, may be referred to as an elevation axis. The Z axis (or elevation axis) extends into the page in FIG. 2 through a thickness (not shown) of the printed circuit 200.

FIG. 2 shows a single via sub-set 202. In some embodiments, the printed circuit 200 may include a quad array (not shown) that includes a plurality of the via sub-sets 202. The quad array may be similar or identical to the quad arrays 502 or 602 (shown in FIGS. 7 and 8, respectively). The quad array may include a variety of via sub-sets. For example, the quad array may include one or more of the via sub-sets 202, one or more of via sub-sets 258 (shown in FIG. 3), one or more of via sub-sets 302 (shown in FIG. 5), one or more of via sub-sets 402 (shown in FIG. 6), one or more of via sub-sets 504 (shown in FIG. 7), one or more of via sub-sets 604 (shown in FIG. 7), or other via sub-sets. The via sub-sets may be positioned relative to one another to permit routing of the quad lines away from (or toward) the quad array. One or more of the quad lines may extend between and interconnect via sub-sets of different quad arrays.

The via sub-set 202 includes a plurality of conductive vias 206 having a designated spatial relationship that is configured for quad signaling. The conductive vias 206 extend through the planar substrate 201 in a direction that is perpendicular to the X and Y axes (or perpendicular to the lateral plane 294 (FIG. 4)). In other words, the conductive vias 206 extend parallel to the Z axis. The conductive vias 206 may extend entirely through the planar substrate 201 or only partially through the planar substrate 201.

The conductive vias 206 include ground vias 208 and signal vias 210. The signal vias 210 in FIG. 2 are arranged to form a single quad group 212. The signal vias 210 of the quad group 212 are positioned to form a two-by-two arrangement of the signal vias 210. As used herein, when signals vias are positioned in a "two-by-two arrangement" or when signal traces are positioned in a "two-by-two formation," the corresponding elements form a substantially rectangular shape when viewed along an axis that is parallel to the length of the signal pathway. For example, the signal vias 210 form a square-shaped two-by-two arrangement (indicated by dashed line 215) in FIG. 2 when viewed along the Z-axis. In such embodiments, the quad group 212 is symmetric about a first axis 291 that is parallel to the X-axis and symmetric about a second axis 292 that is parallel to the Y-axis. The first and second axes 291, 292 intersect each other at a center 293 of the quad group 212.

The via sub-set 202 has a first dimension 214 that is measured along the X-axis and a second dimension 216 that is measured along the Y-axis. The first and second dimensions 214, 216 define an area of the via sub-set 202. The first dimension 214 is defined by surfaces of the outermost ground vias 208 that face in opposite directions along the X-axis. The second dimension 216 is defined by surfaces of the outermost ground vias 208 that face in opposite directions along the Y-axis. Each of the first and second dimensions 214, 216 may be, for example, less than 5 mm or less than 4 mm. However, alternative embodiments may have first or second dimensions that are greater than 5 mm. In the illustrated embodiment, the first and second dimensions 214, 216 are equal, but the first and second dimensions 214, 216 may not be equal in other embodiments.

The signal vias 210 are plated thru-holes (PTHs) that are configured to receive conductor tails (not shown) of an electrical connector (not shown). As shown with respect the signal via 210-4, each of the signal vias 210 may include a conductive material 220 that is plated along an interior surface 222 of the planar substrate 201. The conductive material 220 may form a pad 228 along the first side 204 and, optionally, the second side (not shown). The planar substrate 201 may be drilled to form the interior surface 222. When the conductive material 220 is plated to the interior surface 222, a receiving passage 224 is formed that is defined by an inner surface 226 of the conductive material 220. The receiving passage 224 is configured to receive a corresponding conductor tail. The conductor tail mechanically engages the inner surface 226. For example, the conductor tail may be radially compressed and possibly deformed by the conductive material 220. The mechanical connection also establishes an electrical connection between the conductor tail and the signal via 210. The ground vias 208 may be formed in a similar manner.

The receiving passage 224 may be open at both ends of the signal via 210. Each end may receive and engage a corresponding conductor tail (not shown) such that the signal via 210 electrically couples the two conductor tails. In such embodiments, the signal vias 210 may not be electrically coupled to conductive traces. More specifically, the signal vias 210 may not be interconnected to other signal vias through conductive traces. In other embodiments, however, the printed circuit 200 may include conductive traces that electrically couple to corresponding signal vias 210 as described below.

Also shown in FIG. 2, the via sub-set 202 includes a shield array 230 that is formed by the ground vias 208. The shield array 230 surrounds the quad group 212. The shield array 230 is configured to reduce or impede crosstalk from adjacent quad lines or, more specifically, adjacent quad groups 212. In the illustrated embodiment, the shield array 230 defines the first and second dimensions 214, 216. The shield array 230 may be electrically coupled to ground planes 282, 284 (shown in FIG. 4) of the printed circuit 200.

In the illustrated embodiment, the shield array 230 includes eight ground vias 208-1, 208-2, 208-3, 208-4, 208-5, 208-6, 208-7, and 208-8. The quad group 212 includes signal vias 210-1, 210-2, 210-3, and 210-4. In some embodiments, each of the signal vias 210 of the quad group 212 is associated with two of the ground vias 208 such that the corresponding signal via 210 is closer to the associated ground vias 208 than the other ground vias 208 or the other signal vias 210. These two ground vias 208 may form a ground corner 232. The two ground vias 208 are separated by a gap distance 234. The gap distance 234 and the position of the ground vias 208 are configured to electrically isolate the associated signal via 210 from external crosstalk. For example, the ground vias 208-6, 208-7 may absorb unwanted energy (e.g., crosstalk) that is flowing toward the signal via 210-4 from outside the quad group 212 and along the X-axis and/or the Y-axis. Collectively, the ground corners 232 surround the quad group 212.

Also shown, a routing lane 236 exists between adjacent ground corners 232. More specifically, a routing lane 236 exists between the ground vias 208-1, 208-2 and between the signal vias 210-1, 210-2; a routing lane 236 exists between the ground vias 208-3, 208-4 and between the signal vias 210-2, 210-3; a routing lane 236 exists between the ground vias 208-5, 208-6 and between the signal vias 210-3, 210-4; and a routing lane 236 exists between the ground vias 208-7, 208-8 and between the signal vias 210-4, 210-1. In some embodiments, the routing lanes 236 may be sized to permit conductive traces (not shown) to be routed through the shield array 230 so that the signal vias 210 may be interconnected to signal vias of other quad groups. In some embodiments, the routing lanes 236 may not exist and, instead, the space may be occupied by another ground via 208.

FIG. 2 also indicates an anti-pad 238 by a dashed line that forms a rounded square. The anti-pad 238 is a clearance hole in the ground plane that permits the signal vias 210 to extend through the planar substrate 201. As shown, the anti-pad 238 is a single hole that permits the entire quad group 212 to extend through the planar substrate 201.

Figure 3:
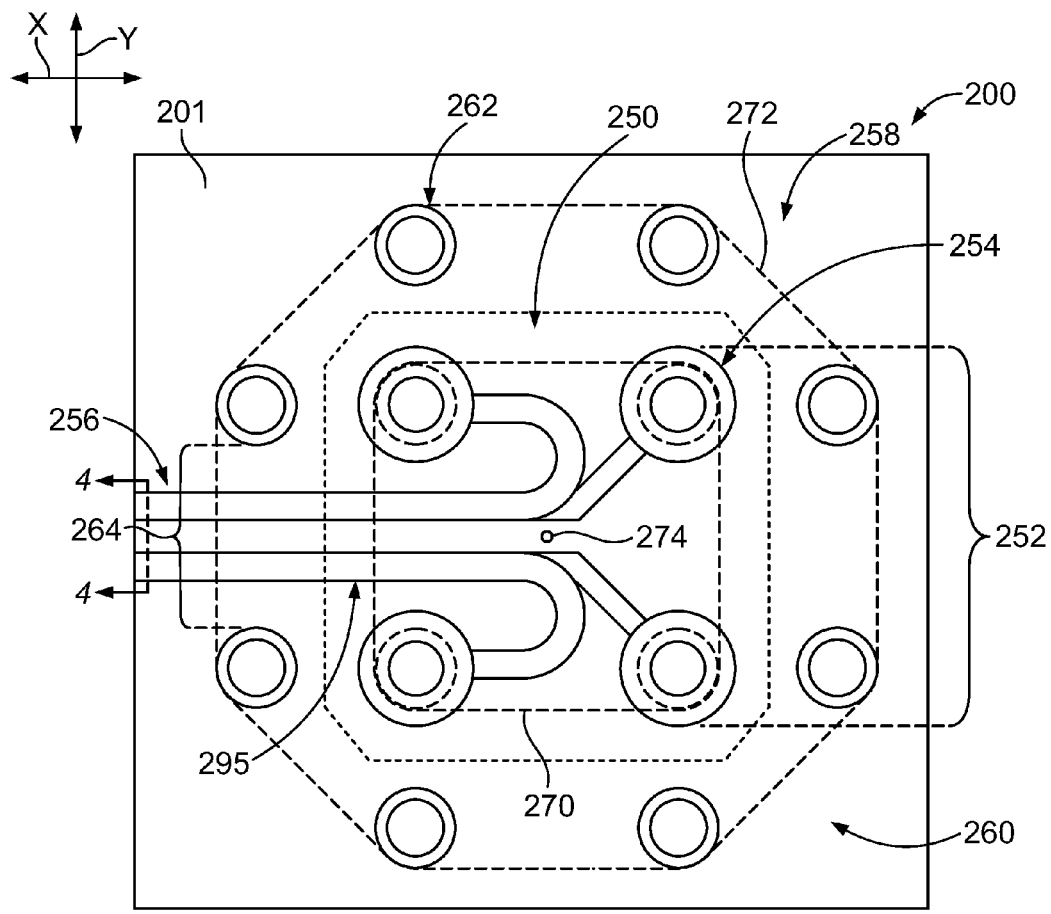
FIG. 3 is a plan view of another portion of the printed circuit of FIG. 2 that illustrates a quad line in accordance with an embodiment.

FIG. 3 is a plan view of another portion of the printed circuit 200 that illustrates a via sub-set 258 and a quad line 250. The quad line 250 includes a quad group 252 of signal vias 254. The quad line 250 also includes a plurality of signal traces 256 that are coupled to the planar substrate 201 and extend parallel to the X and Y axes (or the lateral plane 294 (FIG. 4)). The via sub-set 258 includes the signal vias 254 and also includes a shield array 260 of ground vias 262. In the illustrated embodiment, the via sub-set 258 has an identical configuration as the configuration of the via sub-set 202 (FIG. 2). In other embodiments, however, the via sub-set 258 may include a different configuration of conductive vias.

The signal vias 254 form a signal perimeter 270, and the ground vias 262 form a shield perimeter 272. The signal and shield perimeters 270, 272 are indicated by dashed lines in FIG. 3. The signal perimeter 270 is square-shaped. In the illustrated embodiment, the shield perimeter 272 has an octagonal shape, but other shapes may be used. The shield perimeter 272 defines an outer boundary of a subset zone and the signal perimeter 270 defines an outer boundary of a signal zone that is within the subset zone. Outside the shield perimeter 272, the signal traces 256 may maintain a two-by-two formation.

Figure 4:
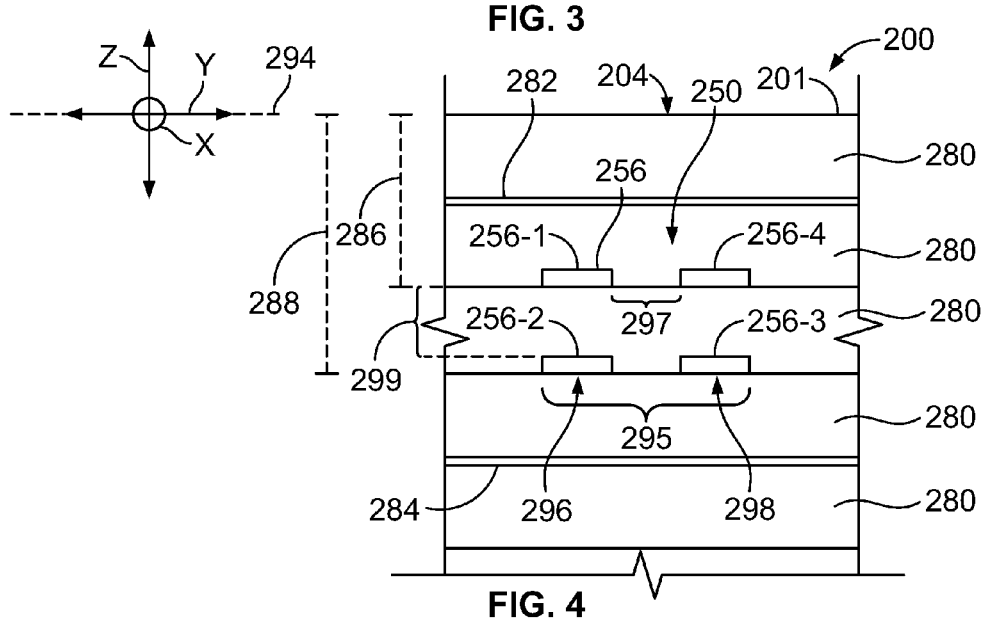
FIG. 4 illustrates a portion of a cross-section of the printed circuit of FIG. 2 taken along the line 4-4 shown in FIG. 3.

FIG. 4 illustrates a portion of a cross-section of the printed circuit 200 taken along the line 4-4 shown in FIG. 3. The portion shown in FIG. 4 includes only parts of five substrate layers 280 that are stacked side-by-side along the Z-axis. The printed circuit 200 includes a first ground plane 282 and a second ground plane ground plane 284 that are positioned along the respective interfaces between two adjacent substrate layers 280. The signal traces 256 of the quad line 250 are disposed between the first and second ground planes 282, 284 and extend lengthwise along the lateral plane 294. In FIG. 4, the signal traces 256 are extending lengthwise along the X axis, but it should be understood that the signal traces 256 may be routed in a two-by-two formation 295 in any direction that is parallel to the lateral plane 294.

The four signal traces 256 of the quad line 250 extend parallel to one another in the two-by-two formation. The four signal traces are referenced specifically as signal traces 256-1, 256-2, 256-3, 256-4. In the two-by-two formation 295, two of the signal traces 256-1, 256-4 are at a first depth 286 in the planar substrate 201, and the other two signal traces 256-2, 256-3 are at a different second depth 288 in the planar substrate 201. The first and second depths 286, 288 may be measured relative to the first side 204 or relative to one of the ground planes 282, 284.

The four signal traces 256 form two trace pairs 296, 298. The trace pair 296 includes the signal traces 256-1 and 256-2 and the trace pair 298 includes the signal traces 256-3 and 256-4. The signal traces 256-1, 256-2 of the trace pair 296 are vertically aligned along the Z axis, and the signal traces 256-3, 256-4 of the trace pair 298 are also vertically aligned along the Z axis. In FIG. 4, the trace pairs 296, 298 are separated from each other by a lateral distance 297. The signal traces 256-1 and 256-2 are separated by a vertical distance 299, and the signal traces 256-4 and 256-3 are separated by the same vertical distance 299.

The lateral distance 297 and the vertical distance 299 are spaced relative to one another to facilitate quad signaling. For example, the lateral distance 297 and the vertical distance 299 are configured such that the three mode impedances are substantially equal along the quad line and approximately equal coupling among the signal traces is achieved. In the illustrated embodiment, the vertical distance 299 is greater than the lateral distance 297, but the signal traces may have other spatial relationships. In some cases, as described below, the trace pairs 296, 298 may jog away from each and back toward each other such that the lateral distance 297 varies. Such configurations may be used to control skew. Nonetheless, the two signal traces of the respective trace pairs may be vertically aligned as the trace pairs move away or toward each other such that a rectangular two-by-two formation is maintained.

Returning to FIG. 3, the signal traces 256 of the quad line 250 extend through a routing lane 264 and break from the two-by-two formation 295 within the shield perimeter 272 and within the signal perimeter 270. In particular, the signal traces 256 of the quad line 250 break from the two-by-two formation 295 proximate to a center 274 of the quad group 252. As used herein, a quad line "breaks from the two-by-two formation" when the signal traces of the quad line no longer maintain the rectangular arrangement and/or a separation distance of the two-by-two formation exceeds a designated amount. By breaking near the center 274 in the embodiment of FIG. 3, the quad signaling may be improved. However, in some cases, it may be necessary to break from the two-by-two formation at another location in order to route the signal traces. Such embodiments are described with respect to FIGS. 5 and 6.

Figure 5:
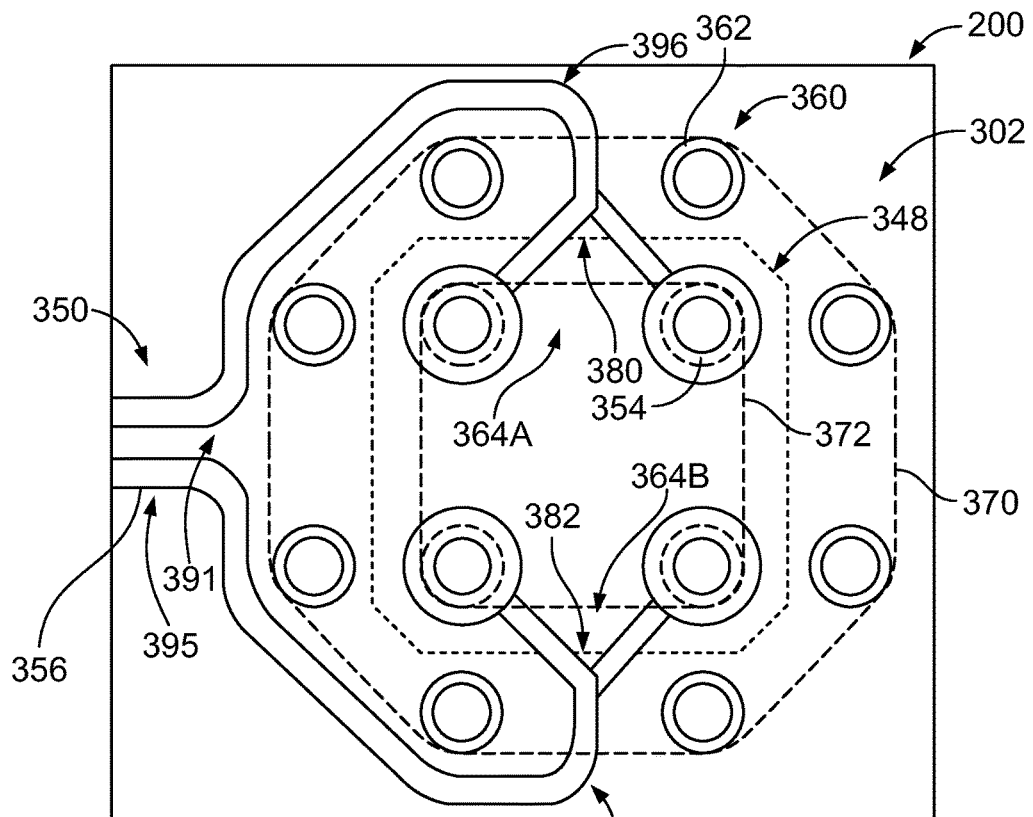
FIG. 5 is a plan view of another portion of the printed circuit of FIG. 2 that illustrates a quad line in accordance with an embodiment.

FIG. 5 is a plan view of another portion of the printed circuit 200 that illustrates a via sub-set 302 and a quad line 350. In the illustrated embodiment, the via sub-set 302 is identical to the via sub-set 258 (FIG. 3) and the via sub-set 202 (FIG. 2), but the via sub-set 302 may have a different configuration in other embodiments. For example, the via sub-set 302 may include a different pattern of ground vias 362. In FIG. 5, the ground vias 362 form a shield array 360 that surrounds a quad group 348 of signal vias 354. The shield array 360 defines a shield perimeter 370, the quad group 348 defines a signal perimeter 372.

The quad line 350 includes a trace pair 396 and a trace pair 398. As shown, the quad line 350 breaks from a two-by-two formation 395 at a break location 391 that is outside the shield perimeter 370. More specifically, the trace pairs 396, 398 extend in opposite directions away from each other at the break location 391. This pattern may not maintain a desirable quality of quad signaling if maintained for a substantial length. Nonetheless, the quad signaling may be sufficient if the two-by-two formation 395 breaks proximate to the via sub-set 302 as shown in FIG. 5. For example, the quad line 350 may break from the two-by-two formation 395 within 2 mm or within 1 mm of the shield perimeter 370.

The trace pairs 396, 398 may be directed partially around the shield array 360. As shown, the trace pairs 396, 398 cross or clear the shield array 360 through respective routing lanes 364A, 364B. Signal traces 356 of each trace pair 396, 398 break with respect to each other at break locations 380 and 382, respectively. As shown, the break locations 380, 382 are within the shield perimeter 370, but outside of the signal perimeter 372.

Figure 6:
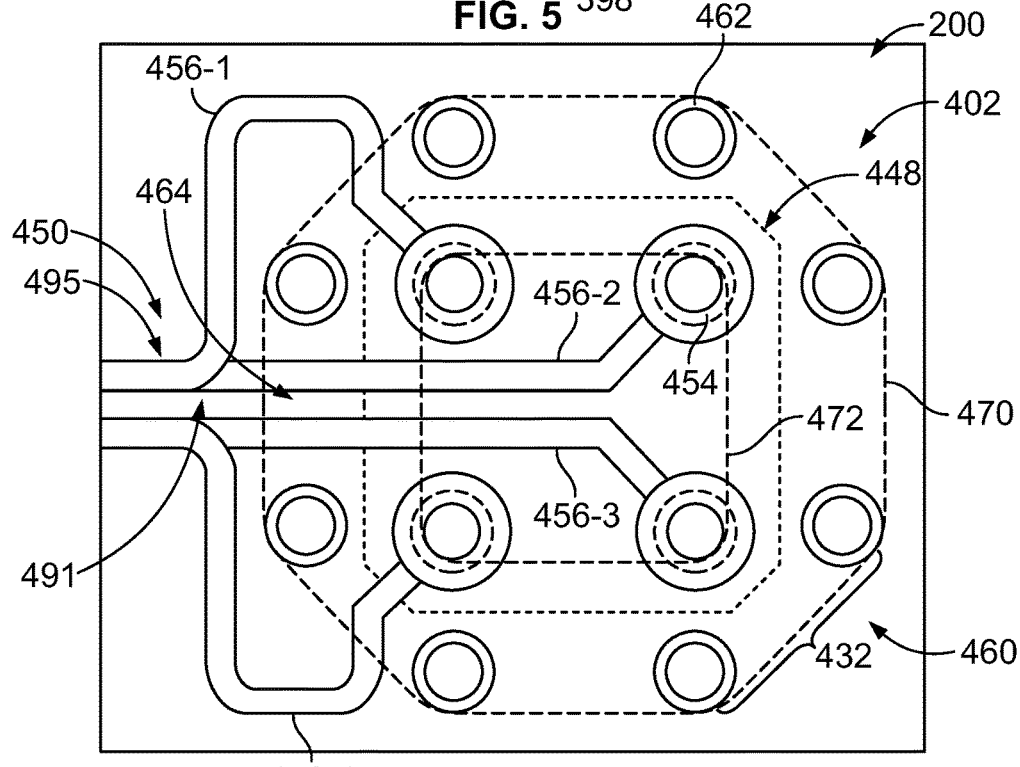
FIG. 6 is a plan view of another portion of the printed circuit of FIG. 2 that illustrates a quad line in accordance with an embodiment.

FIG. 6 is a plan view of another portion of the printed circuit 200 that illustrates a via sub-set 402 and a quad line 450. In the illustrated embodiment, the via sub-set 402 is identical to the via sub-set 202 (FIG. 2), the via sub-set 258 (FIG. 3), and the via sub-set 302 (FIG. 5), but the via sub-set 402 may have a different configuration in other embodiments. The via sub-set 402 includes ground vias 462 that form a shield array 460 that surrounds a quad group 448 of signal vias 454. The shield array 460 includes a plurality of ground corners 432 that each include two of the ground vias 462. The ground corners 432 may be identical to the ground corners 232 (FIG. 2). For example, the ground vias 462 of a corresponding ground corner 432 may be closer to each other than an adjacent ground via 462 of another ground corner 432. The shield array 460 defines a shield perimeter 470, and the quad group 448 defines a signal perimeter 472.

The quad line 450 includes signal traces 456-1, 456-2, 456-3, and 456-4. As shown, the quad line 450 breaks a two-by-two formation 495 at a break location 491 that is outside the shield perimeter 470. The signal traces 456-1 and 456-4 extend in opposite directions away from each other at the break location 491. The signal traces 456-2, 456-3 extend parallel to each other through a routing lane 464. Again, although this pattern may not permit sufficient quad signaling if maintained for a substantial length, the quad signaling may be sufficient if the two-by-two formation breaks proximate to the via sub-set 402 as shown in FIG. 6.

The signal traces 456-1, 456-4 have a common first depth, such as the first depth 286 (FIG. 4), and extend away from each other at the break location 491. Each of the signal traces 456-1 and 456-4 is routed between the corresponding ground vias 462 of a respective ground corner 432. In FIG. 6, the signal traces 456-1 and 456-4 have been lengthened for skew matching. The signal traces 456-2 and 456-3 have a common depth, such as the second depth 288 (FIG. 4). The signal traces 456-2 and 456-3 are directed through the routing lane 464. The signal traces 456-2 and 456-3 extend between adjacent ground vias 462 and adjacent signal vias 454. The signal traces 456-1 and 456-4, however, are not directed between adjacent signal vias 454.

Figure 7:
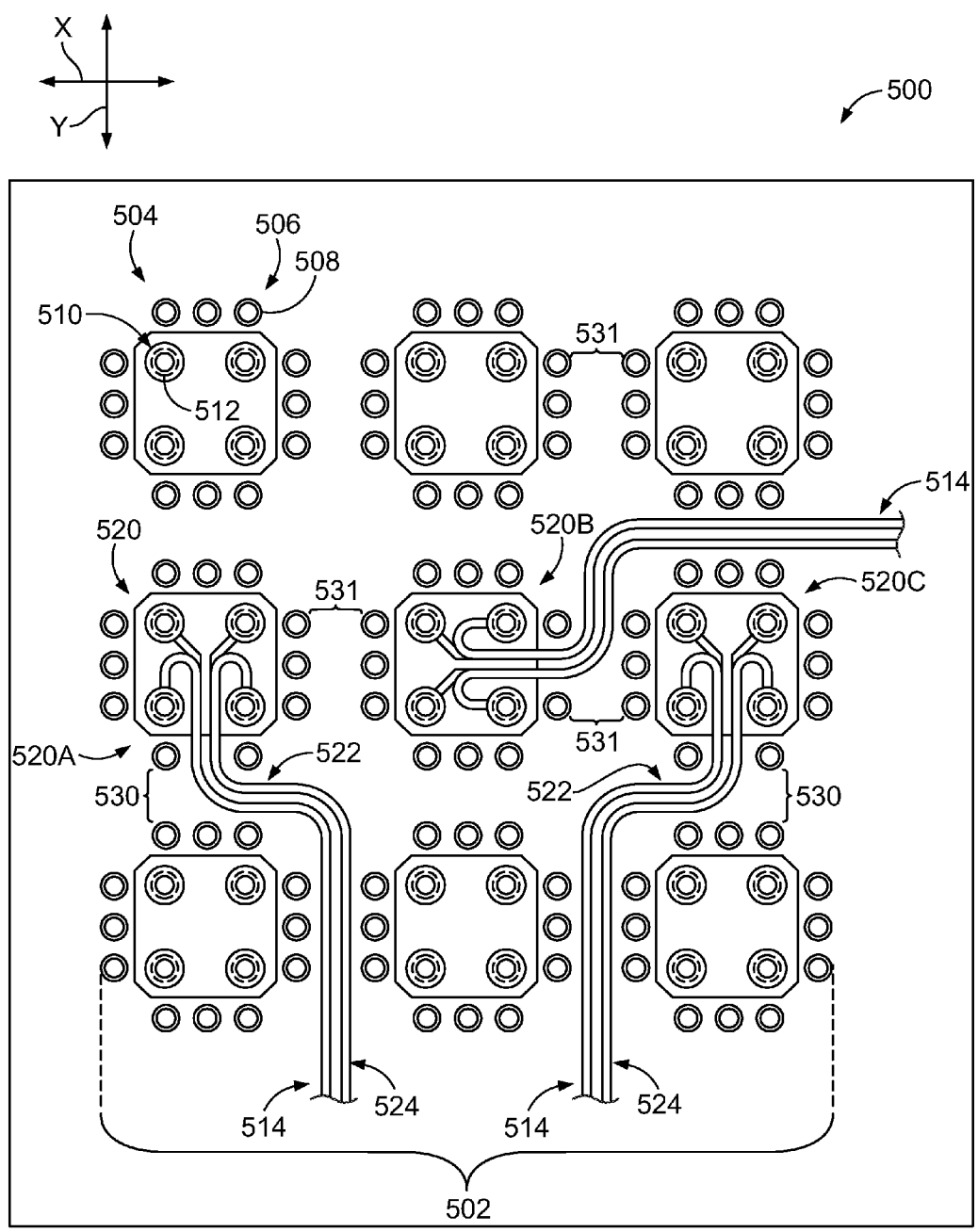
FIG. 7 is a plan view of a printed circuit formed in accordance with an embodiment having a quad array.

FIG. 7 is a plan view of a printed circuit 500 having a quad array 502 in accordance with an embodiment. The quad array 502 includes a plurality of via sub-sets 504. The via sub-sets 504 are arranged in rows and columns. Each via sub-set 504 includes a shield array 506 of ground vias 508 and a quad group 510 of signal vias 512. Each shield array 506 surrounds the corresponding quad group 510 to reduce crosstalk between adjacent quad groups 510 in the quad array 502.

A total of nine via sub-sets 504 are shown in FIG. 7. Three of the nine via sub-sets 504 are electrically coupled to signal traces 514. The signal traces 514 and the corresponding quad groups 510 form respective quad lines 520. The remaining quad groups 510 may also be electrically coupled to signal traces (not shown), but these signal traces may be at different depths than the depths of the signal traces 514. Alternatively, one or more of the remaining quad groups 510 may not electrically couple to corresponding signal traces. Instead, each of the signal vias 512 may electrically interconnect two conductor tails (not shown) as described above with respect to FIG. 2.

In the illustrated embodiment, adjacent via sub-sets 504 are spaced apart by separation gaps 530, 531 to permit the quad lines 520 to be routed therebetween. For example, each of the quad lines 520 includes first and second segments that extend in perpendicular directions with respect to each other. More specifically, each of the quad lines 520A, 520C includes a first segment 522 that extends parallel to the X axis. The first segments 522 extend through respective separation gaps 530. Each of the quad lines 520A, 520C also includes a second segment 524 that extends parallel to the Y axis. The second segments 524 extend through respective separation gaps 531. The first and second segments 522, 524 also extend between ground vias 508 of adjacent via sub-sets 504. Accordingly, the separation gaps 530, 531 permit the signal traces 514 of the quad lines 520 to be routed in two directions that are perpendicular to each other within the quad array 504.

Figure 8:
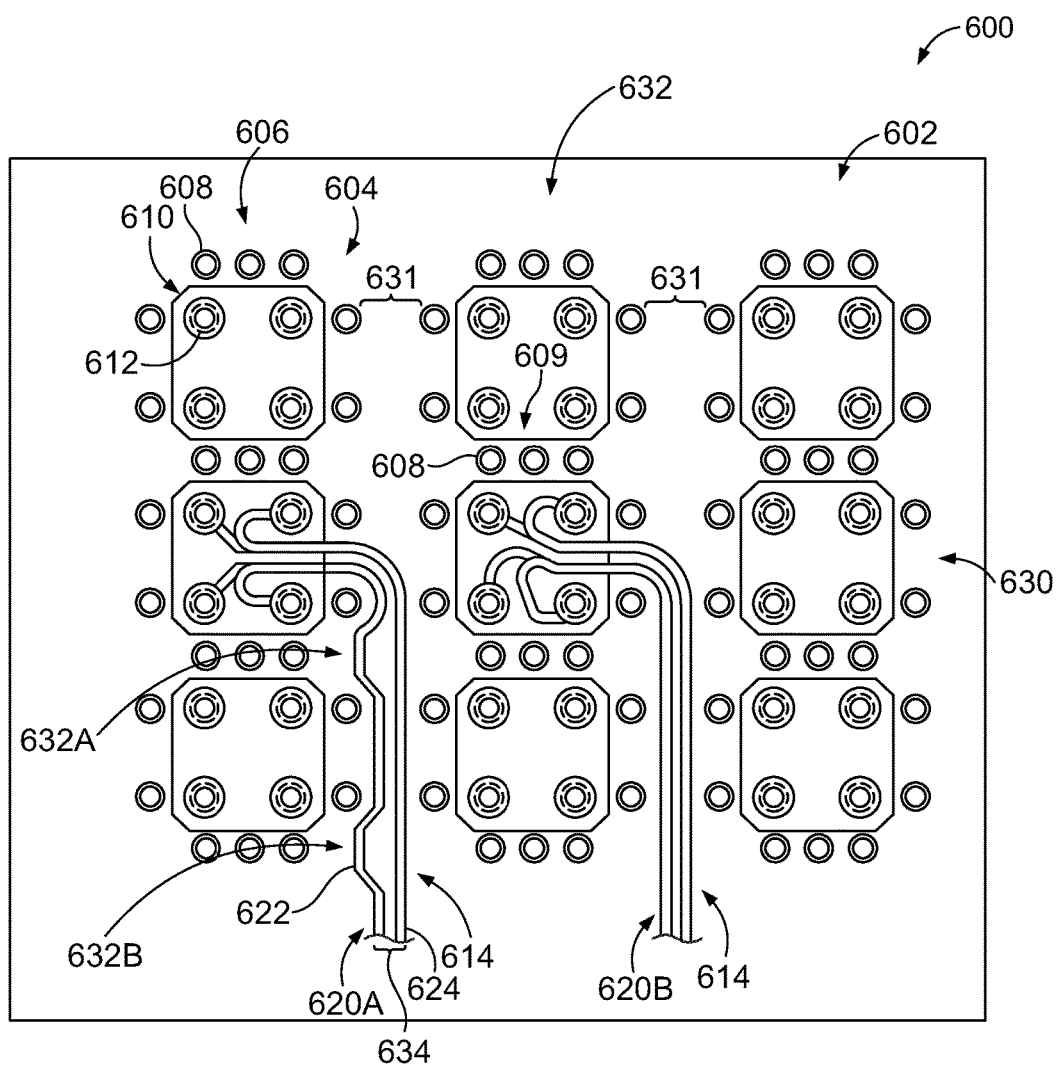
FIG. 8 is a plan view of a printed circuit formed in accordance with an embodiment having a quad array.

FIG. 8 is a plan view of a printed circuit 600 having a quad array 602 in accordance with an embodiment. The quad array 602 includes a plurality of via sub-sets 604. Each via sub-set 604 includes a shield array 606 of ground vias 608 and a quad group 610 of signal vias 612. Each shield array 606 surrounds the corresponding quad group 610 to reduce crosstalk between adjacent quad groups 610 in the quad array 602. The via sub-sets 604 are arranged in rows 630 and columns 632. The columns 632 of via sub-sets 604 are spaced apart by separation gaps 631. The rows, however, are not spaced apart. Instead, adjacent shield arrays 606 share a wall 609 of the ground vias 608. In such embodiments, the quad array 602 may have a greater density of via sub-sets 604.

Also shown in FIG. 8, two of the nine via sub-sets 604 are electrically coupled to signal traces 614. The signal traces 614 and the corresponding quad groups 610 form respective quad lines 620A, 620B. As shown, the signal traces 614 of the quad line 620A form trace pairs 622, 624. The trace pairs 622, 624 are patterned or shaped to extend away from each other for two small lengths (indicated at 632A, 632B) of the path of the quad line 620A. More specifically, the trace pair 622 jogs away from and back toward the trace pair 624. As the trace pair 622 moves away and back toward the trace pair 624, the signal traces 614 maintain a two-by-two formation 634. For example, the two-by-two formation 634 may change between a square-shaped formation to an elongated rectangular formation. Such configurations may be utilized to control electrical performance. For example, the changing two-by-two formation 634 may be used to control skew while maintaining a sufficient level of signal quality.

Figure 9:
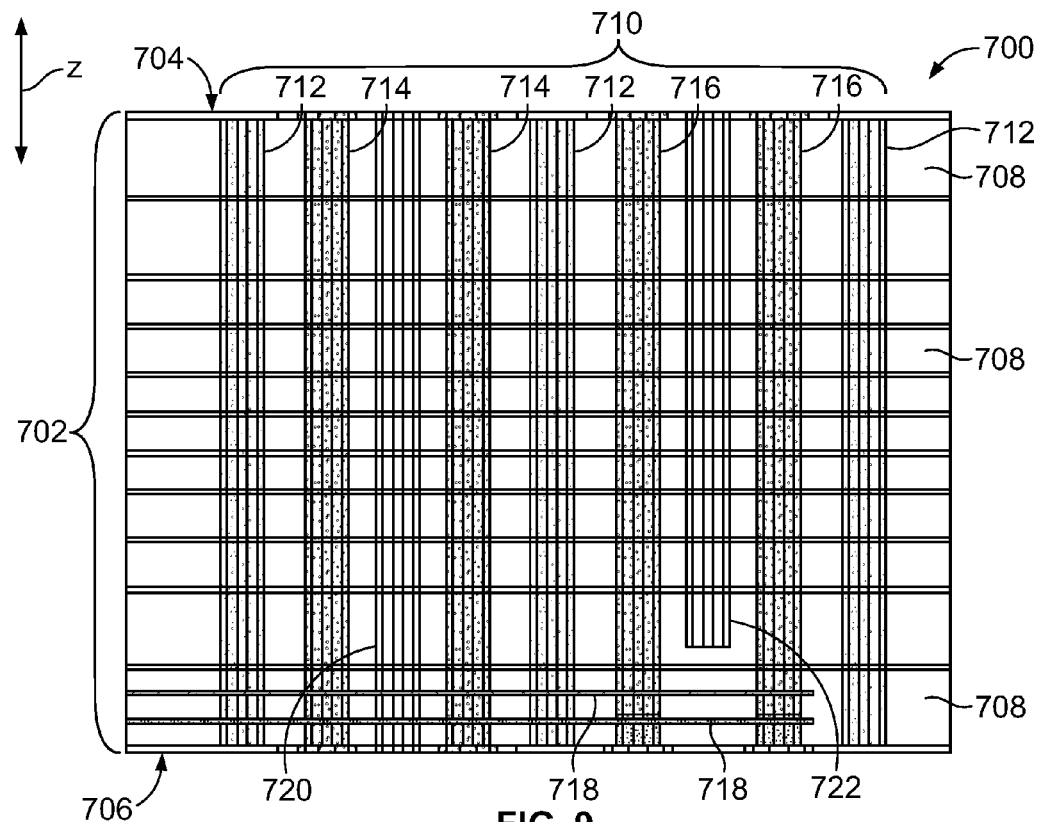
FIG. 9 is a side view of a portion of a printed circuit formed in accordance with an embodiment.

FIG. 9 is a side view of a printed circuit 700 formed in accordance with an embodiment. The printed circuit 700 may include similar features as described above with respect to the printed circuits 200 (FIG. 2), 500 (FIG. 7), and 600 (FIG. 8). For example, the printed circuit 700 includes a planar substrate 702 having opposite first and second sides 704, 706. The planar substrate 702 is formed from a plurality of substrate layers 708. In the illustrated embodiment, the planar substrate 702 includes eleven (11) substrate layers 708 that are stacked with respect to one another along a Z axis (or elevation axis). However, embodiments may include a different number of substrate layers. The printed circuit 700 has a plurality of conductive vias 710 extending therethrough between the first side 704 and the second side 706. The conductive vias 710 include ground vias 712 and signal vias 714, 716. The signal vias 716 electrically couple to signal traces 718. The signal vias 714 do not electrically couple to signal traces.

The printed circuit 700 also includes air holes 720 and 722. The air holes 720 are positioned adjacent to the signal vias 714 and extend entirely through the planar substrate 702. The air holes 722 are positioned adjacent to the signal vias 716 and extend only partially through the planar substrate 702.

Figure 10:
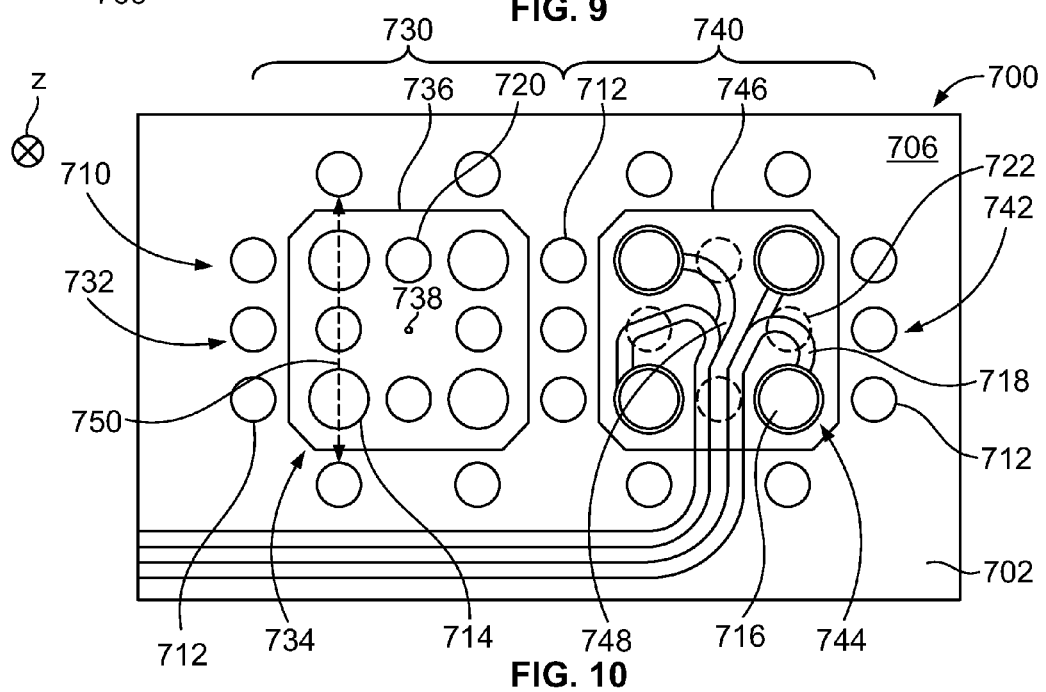
FIG. 10 is a plan view of a portion of the printed circuit of FIG. 9.

FIG. 10 is a plan view of a portion of the second side 706 of the printed circuit 700 and illustrates a via sub-set 730 and a via sub-set 740. Each of the via sub-sets 730, 740 is formed from the conductive vias 710. The via sub-set 730 includes a shield array 732 of the ground vias 712 and a quad group 734 of the signal vias 714 that is surrounded by the shield array 732. The via sub-set 740 also includes a shield array 742 of the ground vias 712 and a quad group 744 of the signal vias 716 that is surrounded by the shield array 742. The shield arrays 732, 742 share three of the ground vias 712. The quad groups 734, 744 extend through anti-pads 736, 746, respectively.

The air holes 720, 722 are configured to increase impedance for the quad groups 734, 744, respectively. In particular, the air holes 720, 722 may be provided to balance the impedances of the three different modes. The air holes 720, 722 may be drilled from the first side 704 (FIG. 9) to the second side 706 through the respective anti-pads 736, 746. The air holes 720 are positioned in a two-by-two arrangement that is rotated with respect to a center axis 738. More specifically, each air hole 720 is positioned between adjacent signal vias 714 such that a quad plane 750 that is parallel to the Z axis intersects two signal vias 714 and a corresponding air hole 720.

The air holes 722 are also positioned in a two-by-two arrangement that is rotated with respect to a center axis 748 such that each air hole 722 is positioned between adjacent signal vias 716. However, the air holes 722 do not extend to the second side 706. As shown, the air holes 722 are aligned with the signal traces 718 such that, if the air holes 722 extended entirely through the planar substrate 702, the air holes 722 would intersect respective paths of the signal traces 718.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A printed circuit comprising:
a planar substrate having opposite sides and a thickness extending therebetween, the sides extending parallel to a lateral plane;
a plurality of conductive vias extending through the planar substrate in a direction that is perpendicular to the lateral plane, the conductive vias including ground vias and signal vias, the signal vias being arranged to form a plurality of quad groups in which each quad group includes a two-by-two arrangement of the signal vias, the ground vias being positioned between adjacent quad groups; and
a plurality of signal traces coupled to the planar substrate and extending parallel to the lateral plane;
wherein the signal traces are electrically coupled to respective signal vias of the quad groups to form a plurality of quad lines, each of the quad lines including the signal vias of a corresponding quad group and four of the signal traces, the four signal traces of each quad line extending parallel to one another and being in a two-by-two formation in which two of the signal traces are at a first depth in the planar substrate and the other two signal traces are at a second depth in the planar substrate.

2. The printed circuit of claim 1, wherein the ground vias form shield arrays that surround respective quad groups, the signal traces of each quad line extending in the two-by-two formation outside of the corresponding shield array that surrounds the quad group of the respective quad line.

3. The printed circuit of claim 2, wherein each quad line includes two trace pairs, each trace pair including one of the signal traces at the first depth and one of the signal traces at the second depth, the signal traces for each trace pair being vertically aligned with each other when in the two-by-two formation, wherein the two trace pairs jog away and back toward each other while being in the two-by-two formation.

4. The printed circuit of claim 2, wherein each shield array defines a shield perimeter, the signal traces for at least one quad line breaking from the two-by-two formation within the shield perimeter.

5. The printed circuit of claim 2, wherein the shield arrays include first, second, third, and fourth shield arrays that surround respective quad groups, the signal traces of at least one of the quad lines extending in a first direction between the first and second shield arrays and in a different second direction between the third and fourth shield arrays.

6. The printed circuit of claim 1, wherein each quad group defines a signal perimeter, the signal traces for at least one quad line breaking from the two-by-two formation within the signal perimeter.

7. The printed circuit of claim 1, wherein the ground vias form shield arrays that surround respective quad groups, wherein at least two of the shield arrays share at least one of the ground vias.

8. The printed circuit of claim 1, further comprising air holes extending in the direction that is perpendicular to the lateral plane, the air holes being positioned between adjacent signal vias within a corresponding quad group, the air holes extending only partially through a thickness of the printed circuit.

9. A printed circuit comprising:
a planar substrate having opposite sides and a thickness extending therebetween, the sides extending parallel to a lateral plane; and
a quad array of conductive vias that extend through the planar substrate in a direction that is perpendicular to the lateral plane, the conductive vias including ground vias and signal vias, the signal vias forming a plurality of quad groups in which each quad group includes a two-by-two arrangement of the signal vias configured for quad signaling, the ground vias forming shield arrays that surround respective quad groups and are configured to reduce crosstalk between adjacent quad groups.

10. The printed circuit of claim 9, wherein at least two of the shield arrays share at least one of the ground vias.

11. The printed circuit of claim 9, wherein the quad array has rows and columns of via sub-sets, each of the via sub-sets including one quad group of the plurality of quad groups and the shield array that surrounds the one quad group.

12. The printed circuit of claim 9, wherein at least some of the quad groups do not electrically couple to signal traces.

13. The printed circuit of claim 9, further comprising a plurality of signal traces coupled to the planar substrate and extending parallel to the lateral plane, the signal traces being electrically coupled to respective signal vias of the quad groups to form a plurality of quad lines, each of the quad lines including the signal vias of a corresponding quad group and four of the signal traces, the four signal traces of each quad line extending parallel to one another and being in a two-by-two formation in which two of the signal traces are at a first depth in the planar substrate and the other two signal traces are at a second depth in the planar substrate.

14. The printed circuit of claim 13, wherein the shield arrays include first, second, third, and fourth shield arrays that surround respective quad groups, the signal traces of at least one of the quad lines extending in a first direction between the first and second shield arrays and in a different second direction between the third and fourth shield arrays.

15. The printed circuit of claim 9, further comprising air holes extending in the direction that is perpendicular to the lateral plane, the air holes being positioned between adjacent signal vias within a corresponding quad group.

16. The printed circuit of claim 15, wherein the air holes extend only partially through a thickness of the printed circuit.

17. A circuit board assembly comprising:
an electrical connector having a connector housing and a connector array of signal and ground contacts that are coupled to the connector housing;
a circuit board having the electrical connector mounted thereto, the circuit board comprising:
a planar substrate having opposite sides and a thickness extending therebetween, the sides extending parallel to a lateral plane; and
a plurality of conductive vias extending through the planar substrate in a direction that is perpendicular to the lateral plane, the conductive vias including ground vias and signal vias, the signal vias forming a plurality of quad groups in which each quad group includes a two-by-two arrangement of the signal vias, the ground vias forming shield arrays that surround respective quad groups and are configured to reduce crosstalk between adjacent quad groups; and
wherein the signal and ground contacts of the connector array are configured to electrically and mechanically couple to the signal and ground vias, respectively, of the printed circuit.

18. The circuit board assembly of claim 17, wherein at least two of the shield arrays share at least one of the ground vias.

19. The circuit board assembly of claim 17, further comprising a plurality of signal traces coupled to the planar substrate and extending parallel to the lateral plane, the signal traces being electrically coupled to respective signal vias of the quad groups to form a plurality of quad lines, each of the quad lines including the signal vias of a corresponding quad group and four of the signal traces, the four signal traces of each quad line extending parallel to one another and being in a two-by-two formation in which two of the signal traces are at a first depth in the planar substrate and the other two signal traces are at a second depth in the planar substrate.

20. The circuit board assembly of claim 19, wherein the signal traces of each quad line extend in the two-by-two formation outside of the corresponding shield array that surrounds the quad group of the respective quad line.

* * * * *